(12) United States Patent
Harada et al.

(10) Patent No.: US 8,951,346 B2
(45) Date of Patent: Feb. 10, 2015

(54) SILICA GLASS CRUCIBLE FOR PULLING UP SILICON SINGLE CRYSTAL AND METHOD FOR MANUFACTURING THEREOF

(75) Inventors: Kazuhiro Harada, Akita (JP); Masaki Morikawa, Akita (JP); Satoshi Kudo, Tokyo (JP)

(73) Assignee: Japan Super Quartz Corporation, Akita (JP)

( * ) Notice: Subject to any disclaimer, the term of this patent is extended or adjusted under 35 U.S.C. 154(b) by 1340 days.

(21) Appl. No.: 12/632,970

(22) Filed: Dec. 8, 2009

(65) Prior Publication Data

US 2010/0147213 A1 Jun. 17, 2010

(30) Foreign Application Priority Data

Dec. 9, 2008 (JP) ................................. 2008-313663

(51) Int. Cl.
   *C30B 15/10* (2006.01)
   *C03B 19/09* (2006.01)
(52) U.S. Cl.
   CPC ............... *C03B 19/095* (2013.01); *C30B 15/10* (2013.01); *Y10S 117/90* (2013.01)
   USPC ............. 117/213; 117/200; 117/208; 117/13; 117/900
(58) Field of Classification Search
   USPC ........................... 117/200, 208, 213, 13, 900
   See application file for complete search history.

(56) References Cited

U.S. PATENT DOCUMENTS

| 5,174,801 | A | * | 12/1992 | Matsumura et al. | ........... 65/17.3 |
| 6,340,390 | B1 |  | 1/2002 | Asano et al. | |
| 7,160,387 | B2 |  | 1/2007 | Kishi et al. | |
| 2005/0235907 | A1 | * | 10/2005 | Ohama et al. | ................. 117/200 |
| 2006/0236916 | A1 | * | 10/2006 | Ohama | ............................ 117/13 |
| 2009/0165701 | A1 | * | 7/2009 | Kishi et al. | ....................... 117/13 |
| 2009/0272315 | A1 |  | 11/2009 | Fukui et al. | |
| 2009/0293806 | A1 |  | 12/2009 | Kishi | |
| 2010/0006022 | A1 |  | 1/2010 | Kishi et al. | |

FOREIGN PATENT DOCUMENTS

| JP | 1-261293 | 10/1989 |
| JP | 2-55285 | 2/1990 |
| JP | 5-9097 | 1/1993 |
| JP | 5-105577 | 4/1993 |
| JP | 2000-169287 | 6/2000 |
| JP | 2004-307222 | 4/2004 |
| JP | 2007-210803 | 8/2007 |
| KR | 10-2006-0049676 | 5/2006 |

OTHER PUBLICATIONS

Japan Office action dated Jan. 24, 2012.

* cited by examiner

*Primary Examiner* — Matthew Song
(74) *Attorney, Agent, or Firm* — Greenblum & Bernstein P.L.C.

(57) ABSTRACT

A silica glass crucible for pulling up a silicon single crystal including an outer layer formed from a natural silica glass layer, and an inner layer formed from a synthetic silica glass layer, wherein the synthetic silica glass layer includes a first synthetic silica glass layer formed in a region within a certain range from the center of a crucible bottom section, and a second synthetic silica glass layer formed in a region which excludes the formation region of the first synthetic silica glass layer, and wherein the first synthetic silica glass layer has a thickness of 0.5 mm or more and 1.5 mm or less and a concentration of an OH group included in the first synthetic silica glass layer being 100 ppm or less.

10 Claims, 3 Drawing Sheets

US 8,951,346 B2

SILICA GLASS CRUCIBLE FOR PULLING UP SILICON SINGLE CRYSTAL AND METHOD FOR MANUFACTURING THEREOF

TECHNICAL FIELD

The present invention is related to a silica glass crucible used for pulling up a silicon single crystal and a method for manufacturing the silica glass crucible. In particular, the present invention is related to a layer structure of the silica glass crucible.

BACKGROUND OF THE INVENTION

A silica glass crucible is used in the manufacture of a silicon single crystal. In a Czochralski (CZ) method, polysilicon is charged into a silica glass crucible, heated and melted and a seed crystal is immersed in this silicon melt, and while mutually rotating the crucible and the seed crystal, the seed crystal is slowly pulled up and a silicon single crystal is grown. In order to manufacture a high purity silicon single crystal for use in semiconductor devices, it is necessary that the silicon single crystal not be polluted by an elution of impurities which are included within the silica glass crucible and in addition, the silica glass crucible requires sufficient heat resistance strength.

There is natural silica and synthetic silica in the raw material of the silica glass crucible and generally natural silica has a lower level of purity than synthetic silica but has excellent heat resistance strength whereas synthetic silica has poor heat resistance strength but a high level of purity. Thus, a silica glass crucible having a two layered structure including forming an outer layer of the crucible with natural silica and increasing the strength of the crucible under a high temperature and forming an inner layer of the crucible which contacts with the silicon melt with synthetic silica and which prevents incorporating impurities, is generally used (refer to Japanese Patent Application Laid Open No. H01-261293). In addition, a crucible which has an inner layer with essentially no gas bubbles is also known (refer to Japanese Patent Application Laid Open No. H02-55285) and a method of increasing the purity of an inner periphery by moving impurity metals included in a fused silica glass in the crucible inner periphery to the outer periphery by what is know as electrolytic refining within the crucible melt is also known (refer to Japanese Patent Application Laid Open No. 2004-307222).

The weight of the silicon which is charged into a crucible is increasing due to the large scale of silicon ingots in recent years. As a result, it becomes more difficult to remove gas bubbles which are included within the silicon melt and these gas bubbles are incorporated into the silicon single crystal during growth causing void defects (also called air pockets) which are formed within the crystal. Such problems have become noticeable. Argon (Ar) gas which is attached to the inner surface of the silica glass crucible, and silicon monoxide (SiO) gas which is produced by a reaction between the silica glass crucible and silicon melt are known as causes of the void defects. The void defects caused by gas bubbles largely have a spherical shape with a diameter of 300-500 μm taking up the majority of its size. However, very small void defects with a diameter of 150 μm or less and very large void defects with a diameter of 1 mm or more are also sometimes formed. In this way, void defects caused by gas bubbles clearly have different characteristics to Grown-in defects such as COP (Crystal Originated Particle). Presently, the presence of these defects can not be nondestructively inspected. The void defects can be detected only after a wafer has been cut from the ingot and appear as through holes or pinholes on the surface or interior section of the wafer.

In recent years, the effects on semiconductor devices by pinholes within a wafer are extremely large. The effects of pinholes differ depending on the size, number, position of generation and type of semiconductor device. However, in the latest semiconductor devices which have a very high integration, because the size of pinholes is extremely large compared to COP, devices can not be formed in the space in which pinholes exist. In particular, because yield of the semiconductor device decreases significantly when the number of pinholes within a wafer is large, the wafer itself has to be discarded. Therefore, it is necessary to reduce the possibility of pinholes being included within a wafer to almost zero.

In order to solves this problem, a method of adjusting a furnace pressure when melting polysilicon is proposed, for example, in Japanese Patent Application Laid Open Nos. H05-9097 and 2000-169287. In addition, a method of providing vibration to a crucible and starting growth of a silicon single crystal after reducing gas bubbles which are attached to the inner surface of the crucible is proposed in Japanese Patent Application Laid Open No. 2007-210803.

However, an environment for preventing generation of gas bubbles described above and a process for removing gas bubbles are not sufficient for manufacturing a high quality silicon single crystal without void defects caused by gas bubbles. A new process for actively removing gas bubbles from a silicon melt is required.

SUMMARY OF THE INVENTION

The present invention solves the problems described above and the object of the present invention is to provide a silica glass crucible for pulling up a silicon single crystal which can prevent the production of void defects caused by gas bubbles included within the silicon single crystal. In addition, the object of the present invention is to provide a manufacturing method of a silica glass crucible which can manufacture a high quality silicon single crystal without void defects caused by gas bubbles.

As a result of repeated keen research into the mechanism in which gas bubbles are generated within a crucible which should solve the above described problem, the inventors of the present invention discovered that the thickness of a synthetic silica layer at the crucible bottom participates significantly in the generation of gas bubbles and that it is possible to control the generation of gas bubbles when the synthetic silica layer at the crucible bottom is comparatively thin.

Presently, many of the silica glass crucibles which are used for pulling up a large diameter silicon single crystal are arranged with a synthetic silica layer on an inner layer. This is because synthetic silica has a lower level of impurities than natural silica and therefore the single crystal yield is considered to be high when growing the silicon single crystal over a long period of time. However, because synthetic silica has a low viscosity, places where fragments of the polysilicon come into contact are easy damaged and dents are easily formed by polysilicon chunks eating into the places where the synthetic silica layer is softened. This kind of phenomenon becomes more pronounced the thicker the synthetic silica layer and the possibility that the crucible inner layer will be deformed is high. Furthermore, the crucible bottom easily becomes very hot and SiO gas which is the cause of void defects is easily generated.

The present invention is based on this type of technical findings and the silica glass crucible used for pulling up a silicon single crystal according to the present invention is arranged with an outer layer comprised from an natural silica glass layer and an inner layer comprised from a synthetic silica glass layer, wherein the synthetic silica glass layer includes a first synthetic silica glass layer formed in a region within a certain range from the center a crucible bottom section, and a second synthetic silica glass layer formed in a region excluding the formation region of the first synthetic silica glass layer, wherein the thickness of the first synthetic silica glass layer is 0.5 mm or more and 1.5 mm or less, and a concentration of an OH group included within the first synthetic silica glass layer is 100 ppm or more.

In addition, a method for manufacturing a silica glass crucible for pulling up a silicon single crystal according to the present invention includes a process for depositing a natural silica powder which becomes the raw material for a natural silica glass layer onto the inner surface of a rotating mold, a process for depositing a synthetic silica powder which becomes the raw material for a synthetic silica glass layer onto an inner surface of a layer formed by the natural silica powder, and a process for forming a silica glass crucible including a natural silica glass layer and a synthetic silica glass layer by vitrification by melting the natural silica powder and the synthetic silica powder, wherein the synthetic silica powder is deposited so that the thickness of the synthetic silica glass layer in a region within a certain ranged from the center of the crucible bottom becomes 0.5 mm or more and 1.5 mm or less.

According to the present invention, because the thickness of the synthetic silica glass layer is set at 0.5 mm or more and 1.5 mm or less at the crucible bottom, it is possible to reduce the polysilicon chunks which eat into the silica glass crucible when melting the silicon, and it is possible to prevent Ar becoming trapped in the parts eaten into and damage or dents which cause the generation of SiO gas. Therefore, it is possible to prevent the generation of gas bubbles and prevent the generation of void defects within the silicon single crystal.

In the silica glass crucible according to the present invention, it is preferred that the total concentration of the three elements Na, K and Li which are included in the natural silica glass layer be 0.5 ppm or less in a region covered by at least the first synthetic silica glass layer. If the concentration of impurities in the first synthetic silica glass layer which forms the crucible bottom section meets the above described conditions, it is possible to increase the viscosity of the crucible bottom section and make it more difficult for damage or dents to occur.

In the silica glass crucible according to the present invention, it is preferred that the concentration of Al which is included in the natural silica glass layer be 10 ppm or more and 200 ppm or less in a region covered by at least the first synthetic silica glass layer. If the concentration of impurities in the first synthetic silica glass layer which forms the crucible bottom section is 10 ppm or more, it is possible to increase the viscosity of the crucible bottom section and make it more difficult for damage or dents to occur. In addition, if the concentration of Al is 200 ppm or less, a reduction in the single crystal yield due to a rapid increase in devitrification (crystallization) becomes more unlikely. Even if the concentration of Al within the natural silica glass layer is 100 ppm, devitrification progresses from the outer surface of the crucible during the pulling up process, and when the speed of crystallization progress is very high, there is a possibility that crystallization progresses as far as the vicinity of the crucible inner surface due to use over a long period of time. However, in the case where the upper limit of the Al concentration is 200 ppm, the effects upon the crucible inner layer are limited and it is possible to prevent a reduction in the single crystal yield.

In the present invention, it is preferred that the formation region of the first synthetic silica glass layer include a region within 50% of the crucible diameter from the center of the crucible bottom section.

In this way, according to the present invention, it is possible to provide a silica glass crucible which can manufacture a high quality silicon single crystal and prevent the generation of void defects caused by incorporation of SiO gas bubbles with the silicon single crystal.

In addition, according to the present invention, it is possible to provide a manufacturing method of a silica glass crucible which can manufacture a high quality silicon single substrate with no void defects.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENT

Preferred embodiments of the present invention will now be described in detail hereinafter with reference to the accompanying drawings.

Figure 1:
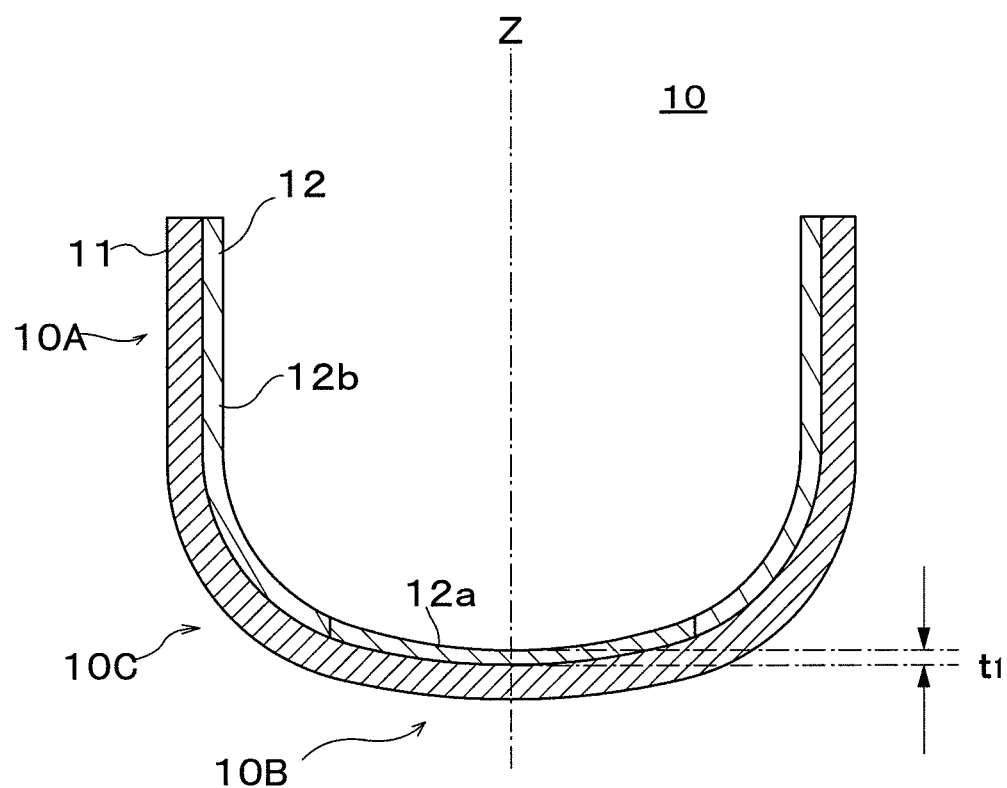
FIG. 1 is a schematic cross sectional view which shows a structure of a silica glass crucible for pulling up a silicon single crystal according to a preferred embodiment of the present invention.

FIG. 1 is a schematic cross sectional view which shows a structure of a silica glass crucible for pulling up a silicon single crystal according to a preferred embodiment of the present invention.

As shown in FIG. 1, a silica glass crucible 10 has a two layer structure comprised of a natural silica glass layer 11 which forms an outer layer and a synthetic silica glass layer 12 which forms an inner layer.

The natural silica glass layer 11 is an amorphous silica glass layer with a natural silica powder as the raw material and is arranged over the entire silica glass crucible 10 from a sidewall section 10A to a bottom section 10B. Generally, natural silica has a higher concentration of metallic impurities and a lower concentration of an OH group than synthetic silica. For example, the concentration of Al in a natural silica glass layer is 1 ppm or more, the concentration of an alkali metal (Na, K and Li) are each 0.05 ppm or more, and the concentration of an OH group is below 50 ppm. Furthermore, whether a natural silica glass layer or not should not be judged on the basis of one element but should be judged as a whole on the basis of a plurality of elements. Because the natural silica glass layer 11 has a higher viscosity at high temperatures compared to the synthetic silica glass layer 12, it is possible to increase the heat resistance strength of the entire crucible. In addition, natural silica is cheaper than synthetic silica making it advantageous in terms of costs.

The synthetic silica glass layer 12 is an amorphous silica glass layer with a synthetic silica powder as the raw material. A synthetic silica glass having a high level of purity synthesized by hydrolysis of silicon alkoxide can be given as an example of synthetic silica. Generally, synthetic silica has a lower concentration of metallic impurities and a higher concentration of an OH group than natural silica. For example, the concentration of each metallic impurity included in synthetic silica is below 0.05 ppm, and the concentration of an OH group is 50 ppm or more. Furthermore, whether a synthetic silica glass layer or not should not be judged on the basis of one element but should be judged as a whole on the basis of a plurality of elements. In this way, because the synthetic silica glass layer 12 has few impurities compared to the natural silica glass layer 11, it is possible to prevent an increase in impurities eluted to the silicon melt from the crucible and it is also possible to increase the silicon single crystal yield.

It is preferred that the vicinity of the inner surface of the silica glass crucible 10 be comprised of a transparent layer which substantially does not include bubbles, and further to the exterior of the transparent layer comprising an opaque layer which includes multiple micro bubbles. In the case where the vicinity of the inner surface of the crucible is a transparent layer, it is possible to prevent an increase in silica fragments which peel off from the inner surface of the crucible, and increase the silicon single crystal yield. In addition, in the case where the exterior of the crucible is comprised of an opaque layer, it is possible to increase the heat capacity of the crucible and temperature control of the silicon melt becomes easier.

The bubble containing ratio of the opaque silica glass layer 11 is preferred to be 0.7-2% and the average diameter of the bubbles are preferred to be around 100 μm. Here, the bubble containing ratio is defined as the ratio ($W_2/W_1$) of a bubble occupied volume ($W_2$) per unit volume ($W_1$). Further, "essentially does not include bubbles" means that the bubble containing ratio is 0.1% or less and the average diameter of the bubbles is 100 μm or less.

The sidewall section 10A of the crucible is a cylindrical section which is parallel to the center axis (Z axis) of the crucible and extends approximately directly down from the opening of the crucible. However, the sidewall section 10A does not have to be completely parallel with respect to the Z axis and may incline so that it gradually widens towards to the opening. In addition, the sidewall section 10A may be a straight line or may curve smoothly.

The bottom section 10B of the crucible is the roughly disk shaped section which includes the intersection point with the crucible Z axis and a corner section 10C is formed between the bottom section 10B and the sidewall section 10A. The bottom section 10B covers at least a projection plane of the silicon single crystal which is pulled up. The shape of the bottom section 10B may be a round bottom or a flat bottom. In addition, it is possible to arbitrarily set the curvature and angle of the corner section 10C. When the bottom section 10B is a round bottom, because the bottom section 10B has adequate curvature, the difference in curvature between the bottom section 10B and the corner section 10C is much smaller than a flat bottom. In the case where the crucible bottom section 10B is a flat bottom, the bottom section 10B has an even or extremely moderate curved surface and the curvature of the corner section 10C is very large. Furthermore, the bottom section 10B is defined as a region in which the tangent angle of inclination of a crucible sidewall surface with respect to a flat surface XY which intersects the Z axis is 30° or less.

The synthetic silica glass layer 12 is comprised from a first synthetic silica glass layer 12a which is arranged within a certain range from the center of the crucible bottom section 10B, and a second synthetic silica glass later 12b which is arranged in a region excluding the formation region of the first synthetic silica glass layer 12a.

The first synthetic silica glass layer 12a plays the role of an original synthetic silica glass layer, prevents damage or dents in the bottom surface of the crucible due to polysilicon chunks, and also plays the role of preventing the generation of gas bubbles within the silicon melt. A synthetic silica is used in the material of the inner surface of the crucible in order to increase the single crystal yield, however, because the viscosity of synthetic silica is lass compared to natural silica, if the thickness is to thick dents are easily formed by the polysilicon when heating and melting and it is thought that these dents become the source for the generation of void defects. As a result, the thickness $t_1$ of the first synthetic silica glass layer 12a is set at 0.5 mm or more and 1.5 mm or less, and the average OH group concentration becomes 100 ppm or less.

When the temperature of the crucible increases, the crucible and the silicon melt react and SiO gas is generated. Specifically, it is thought that when there are dents or damage on the inner surface of the crucible, they become the source for the easy generation of SiO gas. In addition, it becomes easier for Ar which is an atmosphere gas used in the pulling up process to be trapped in the dents. However, when the crucible bottom section 10B is comprised of the first synthetic silica glass layer 12a and as much as possible being a thin and hard synthetic silica glass layer, then it is difficult for damage or dents to be formed on the crucible inner surface. As a result, it is possible to prevent SiO gas being generated due to damage and dents on the crucible inner surface and it is possible to control SiO gas generated from the crucible bottom section 10B in the pulling up process of the silicon single crystal.

The thickness $t_1$ of the first synthetic silica glass layer 12a is required to be 0.5 mm or more and 1.5 mm or less. This is because when the first synthetic silica glass layer 12a is thinner than 0.5 mm, the first synthetic silica glass layer 12a may be completely dissolved when pulling up the silicon single crystal and the natural silica glass layer 11 may be exposed, and when the first synthetic silica glass layer 12a is thicker than 1.5 mm, dents are more easily formed. In the case where the natural silica glass layer 11 contacts with the silicon melt, crystallization occurs easily due to impurities. If crystallization occurs unevenly, the crystallized section will peel off and become attached to an interface between the crystal and the melt. As a result, the possibility of dislocation of the silicon single crystal will increase. Furthermore, the thickness of the first synthetic silica glass layer 12a may be formed uniform or may be formed so that it gradually becomes thicker towards the exterior from the center of the bottom section 10B. In this case, the thickness of the first synthetic silica glass layer 12a is 0.5 mm or more at its thinnest section and 1.5 mm or less at its thickest section.

The thickness of the first synthetic silica glass layer 12a is preferably 0.8-1.3 mm and more preferably 0.8-1.1 mm. As is described in detail below, if the thickness of the first synthetic silica glass layer 12a is 0.8-1.3 mm, it is possible to control the pinhole generation rate to below 0.1%. Furthermore, if the thickness of the first synthetic silica glass layer 12a is 0.8-1.1 mm, it is possible to control the pinhole generation rate to below 0.05% and reduce the pinhole generation rate to almost zero.

It is required that an OH group concentration of the first synthetic silica glass layer 12a be 100 ppm or less. This is because when the OH group concentration does not meet these conditions, the viscosity of the first synthetic silica glass layer 12a becomes lower and the effects resulting from making the layer thickness thinner can no longer be obtained. It is preferred that the OH group concentration of the first synthetic silica glass layer 12a is 70 ppm or less. If the OH group concentration is 70 ppm or less, it is possible to control the pinhole generation rate to below 0.05% and reduce the pinhole generation rate to almost zero.

It is sufficient that the second synthetic silica glass layer 12b play the role of a conventional synthetic silica glass layer and as long as it is able to perform that role, the thickness and OH group concentration is not particularly limited. Therefore, the second synthetic silica glass layer 12b may be thicker than the first synthetic silica glass layer 12a and have a higher OH group concentration than the first synthetic silica glass layer 12a. This is because the possibility that SiO gas bubbles generated from the crucible sidewall section 10A and corner section 100 are incorporated into the silicon single crystal is extremely low. The ascent speed of the SiO gas within the silicon melt is 30-60 cm/sec whereas the convection flow speed of the silicon melt is only a few mm/sec and the generated SiO gas bubbles do not flow with the convection flow but rise almost vertically within the silicon melt. Therefore, the damage and dents formed on the sidewall section 10A and the corner section 100 do not become the cause of void defects.

It is preferred that a minimum value of the thickness of the second synthetic silica glass layer 12b at the sidewall section 10A is larger than a maximum value of the thickness of the first synthetic silica glass layer 12a. This is because the inner surface of the crucible sidewall section 10A is easily eroded compared to the inner surface of the bottom section 10B by the convection flow or melt interface. In addition, this is because it is possible to easily form the first synthetic silica glass layer 12a which is formed so that it gradually becomes thicker towards the exterior from the center of the bottom section 10B, and the second synthetic silica glass layer 12b which is thicker than a maximum value of the thickness of the first synthetic silica glass layer 12a, by controlling the deposited amount of synthetic silica powder so that the synthetic silica glass layer gradually becomes thicker towards the exterior from the center of the bottom section 10B.

Among the impurities included in the natural silica glass layer 11, it is preferred that the total concentration of the three elements Na, K and Li be sufficiently low. These alkali metals included as impurities in the natural silica have the effect of lowering the viscosity of the crucible and when the concentration is too high, dents are easily formed. However, if the total impurity concentration of the above described three elements is sufficiently low, it is possible to increase the viscosity of the crucible and reduce the dents. In particular, in the present embodiment, the first synthetic silica glass layer 12a is thinned as much as possible and a structure is adopted where it is difficult for damage or dents to be formed on the inner surface of the crucible bottom section 10B, however, even in the natural silica glass 11 which becomes an underlayer, by adopting a structure in which it is difficult for dents to form, it is possible to further increase the effects of reducing dents on the crucible inner surface. Specifically, it is preferred that the total concentration of the three elements Na, K and Li in the entire region of the natural silica glass layer 11 is 0.5 ppm or less. Control of the impurity concentration of these elements can be performed by electrolytic refining described below.

Among the impurities included in the natural silica glass layer 11, it is preferred that the concentration of Al is comparatively high. This is because Al is different to the above described alkali metals, has the effect of increasing the viscosity of the crucible and when the concentration is too low, dents are easily formed. By increasing the concentration of Al in the natural silica glass layer 11, it is possible to further increase the effect of reducing dents, the same as the alkali metal impurities described above. Specifically, it is preferred that the concentration of Al in the entire region of the natural silica glass layer 11 is 10 ppm or more. The concentration of Al in the natural silica glass layer 11 can be adjusted by selecting and adjusting the Al concentration within the raw material powder.

Figure 2:
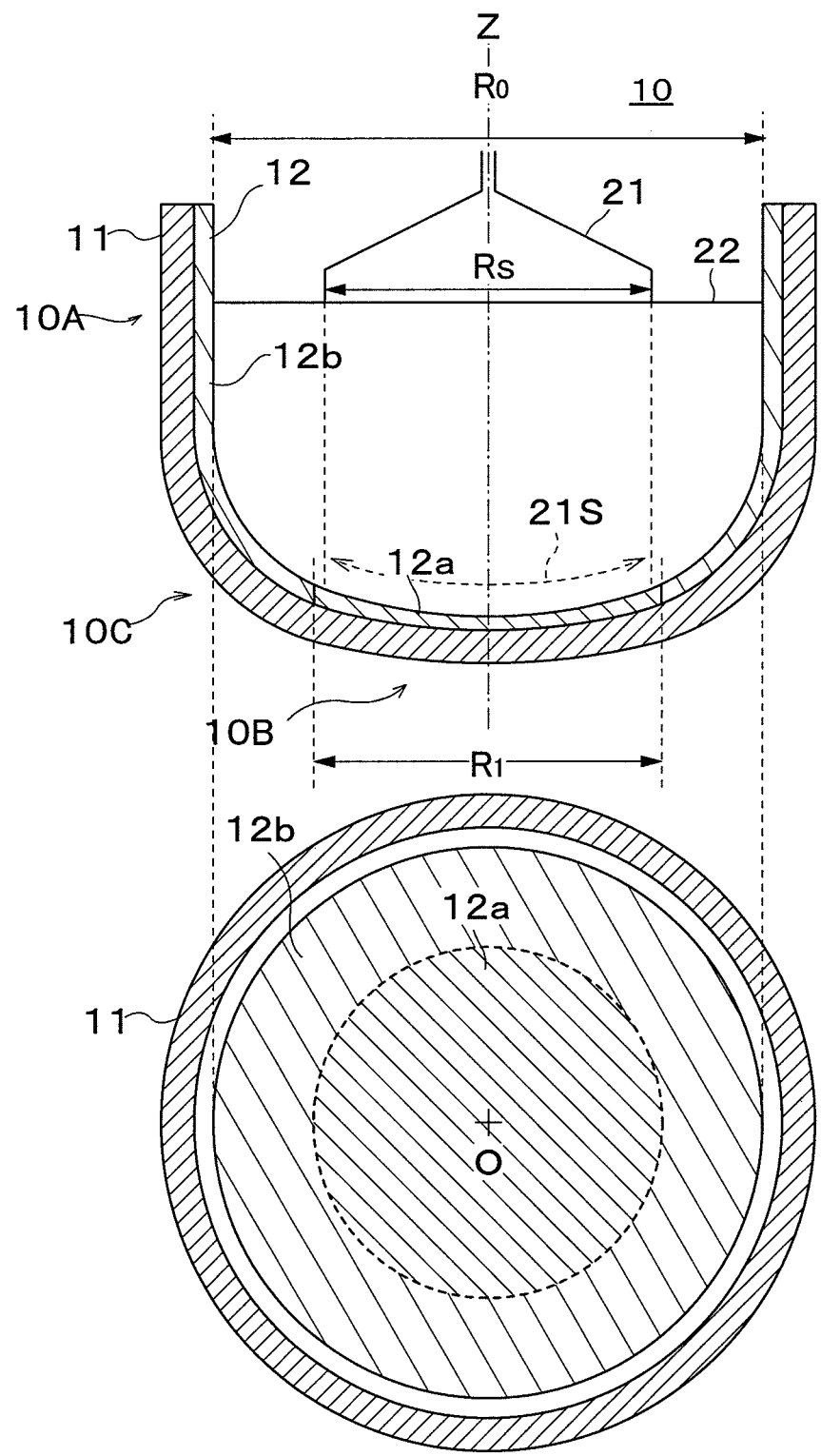
FIG. 2 is a cross sectional and planar view diagram which shows a positional relationship between the silica glass crucible and a silicon single crystal.

FIG. 2 is a cross sectional and planar view diagram which shows a positional relationship between the silica glass crucible and a silicon single crystal.

The shape of the formation region of the first synthetic silica glass layer 12a seen from the Z axis direction is a round shape with an intersection point with the Z axis at the center, and its diameter $R_1$ is more preferably equal to or more than a diameter $R_2$ of the silicon single crystal 21 which is pulled up. In other words, it is preferred that the formation region of the first natural silica glass layer 12a covers the projection plane of 21S of the silicon single crystal 21. Furthermore, the diameter $R_s$ of the silicon single crystal 21 is a few mm to tens of mm larger than the diameter of the final silicon wafer product.

The diameter $R_s$ of the silicon single crystal 21 is not principally determined by the shape or size of the silica glass crucible 10. However, it is significantly dependent on the diameter $R_0$ of the silica glass crucible 10. If the crucible diameter $R_0$ is too small with respect to the silicon single crystal diameter $R_2$, crystal quality control such as oxygen concentration and oxygen in-plane distribution of the single crystal becomes difficult, and if it is too large manufacturing costs increase due to the necessity of increasing the size of devices and components.

Considering these points, it is preferred that the formation region of the first synthetic silica glass layer 12a includes a region within 50% of the diameter of the crucible from the center of the crucible bottom section. This is because if the diameter $R_1$ of the first synthetic silica glass layer 12a is smaller than 0.5 $R_0$, the possibility that SiO gas bubbles generated from the synthetic silica glass layer 12a are incorporated into the silicon single crystal 21 is high.

The diameter $R_1$ of the first synthetic silica glass layer 12a will be explained in detail. For example, in the case of pulling up an approximately 300 mm diameter silicon single crystal using a 32 inch diameter (diameter $R_0$=approximately 800 mm) silica glass crucible, the minimum diameter $R_1$ of the first synthetic silica glass layer 12a formed on the bottom 10B of the crucible becomes 0.5 $R_0$=400 mm. If the diameter $R_1$ of the first synthetic silica glass layer 12a is 400 mm or more, it is possible to effectively reduce the generation of gas bubbles which may be incorporated into the silicon single crystal during the pulling up process.

As explained above, according to the silica glass crucible 10 of the present embodiment, because the relatively hard synthetic silica glass layer 12a is formed as thin as possible on the bottom section 10B of the crucible, it is possible to reduce the SiO gas generated from the crucible bottom section 10B during the pulling up process of the silicon single crystal and also prevent void defects within silicon single crystal.

Figure 3:
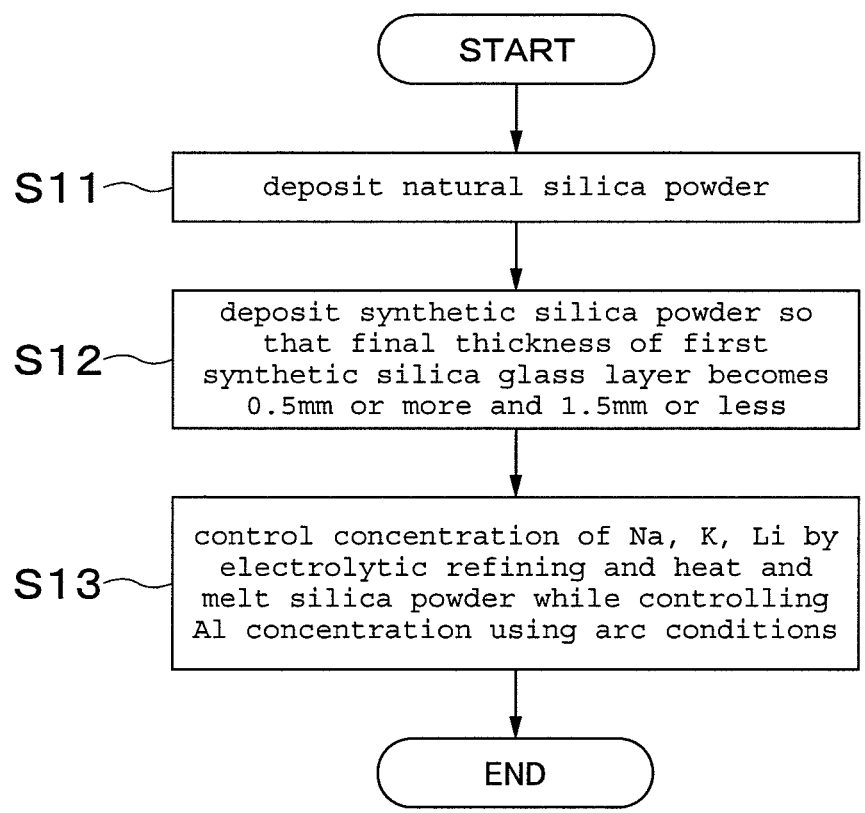
FIG. 3 is a flow chart which shows a manufacturing method of a silica glass crucible for pulling up a silicon single crystal according to a preferred embodiment of the present invention.

Next, a manufacturing method of the silica glass crucible 10 will be explained while referring to the flow chart in FIG. 3.

The silica glass crucible 10 can be manufactured by a rotating mold method. In the rotating mold method, natural silica powder which is the raw material for the natural silica glass layer 11 is deposited to a certain thickness on an inner surface of a rotating carbon mold (step S11). Then, a synthetic silica power is deposited on the inner surface of the layer formed by the natural silica powder (step S12). At this time, the amount of synthetic silica powder is adjusted so that the final thickness of the first synthetic silica glass layer 12a becomes 0.5 mm or more and 1.5 mm or less. In addition, while it is preferred that the OH group concentration of the synthetic silica powder used at this time is 100 ppm or less, because the OH group concentration can also be controlled in a later arc process, it is not essential that the OH group concentration of the synthetic silica powder be 100 ppm or less. In this way, the area (diameter) and thickness of the first and second synthetic silica glass layers 12a and 12b can be adjusted by the thickness of the synthetic silica powder and arc conditions.

Following this, the entire inner surface of the silica powder is heated to 1720° C. or more from the interior of the mold by a discharge heat due to an arc electrode and the silica powder is arc melted (step S13). At this time, the heating conditions of the crucible bottom section are controlled so that the thickness of the first synthetic silica glass layer 12a becomes 0.5 mm or less and 1.5 mm or more and the OH group concentration becomes 100 ppm or less. In addition, at the same time as this heating, pressure decreases from the mold side, gas within the melt silica is sucked to the outer layer side via a vent arranged in the mold, and by discharging the gas to the outside via the vent the gas bubbles of the crucible inner surface are partially removed and a transparent layer is formed with essentially no gas bubbles. Following this, the pressure is weakened or stopped and by forcing the bubbles to remain while continuing heating, an opaque layer including a lot of micro bubbles is formed.

Furthermore, electrolytic refining is performed within the arc melting of the silica powder. In electrolytic refining, a voltage is applied to the mold, impurities of the alkali metals etc included in the melt silica glass of the crucible inner layer are moved to the exterior periphery side and the purity of the fused silica glass layer is increased. By increasing purity in this way, the total concentration of the three elements Na, K and Li included in the natural silica glass layer is controlled to 0.5 ppm or less. In addition, the Al concentration is adjusted by changing the concentration within the raw material powder. Consequently, the Al concentration of the natural silica powder is preferably 10-200 ppm. Apart from this, the specific conditions of heating time, heating temperature, and suction pressure are appropriately determined according to the manufacturing conditions such as silica material and crucible diameter. By the above, the silica glass crucible arranged with the natural silica glass layer 11 which forms an outer layer, and the first and second synthetic silica glass layers 12a, 12b which form an inner layer, is complete.

should be noted that the present invention is in no way limited to the details of the described arrangements but changes and modifications may be made without departing from the scope of the appended claims.

EXAMPLES

Example 1

A sample of a silica glass crucible having the structure shown in FIG. 1 was prepared. The crucible sample had a diameter of 32 inches (diameter $R_0$=800 mm), crucible height of 500 mm, and sidewall section thickness of 17 mm, corner section thickness of 25 mm and bottom section thickness of 14 mm from the inner surface to the exterior surface of the crucible. In addition, the diameter of the first synthetic silica glass layer is 400 mm, thickness was 1.0-1.3 mm (1.0 mm is the thinnest section in the center of the crucible bottom section, 1.3 mm is the thickest section in a periphery position R/2 from the bottom section center, the same is true below), the average OH group concentration (below referred to simply as OH group concentration) of a range up to a depth of 2 mm from the inner surface of the synthetic silica glass layer was 100 ppm, and the total impurity concentration of Na, K and Li in the natural silica glass layer was 0.5 ppm and the impurity concentration of Al in the natural silica glass layer was 14 ppm.

Next, after charging 400 kg of polysilicon chunks into the sample of the silica glass crucible . . . the silica glass crucible was loaded into a single crystal pulling apparatus, the polysilicon was melted in a chamber and a silicon single crystal ingot with a diameter of around 300 mm was pulled up.

Following this, wafers of approximately 1 mm thickness were cut from the silicon single crystal ingot that was pulled up using a wire saw and a polished wafer with a mirror polished surface was created. Then, the generation percentage of pinholes in this polished wafer was measured. A particle measurement device was used to measure the pinhole generation rate and the number of pinholes in the surface of the polished wafer was measured. In addition, the single crystal yield (relative value) of the silicon single crystal ingot was measured. The pinhole generation rate is a figure in which the total number of pinholes included within multiple wafers obtained from one silicon single crystal divided by the number of wafers. In addition, the single crystal yield of a comparative example 1 described below is a relative value used as a reference. The measurement results are shown in Chart 1.

CHART 1

| | Synthetic Silica Layer Thickness (mm) | | OH Group Concentration (ppm) | Natural Silica Layer Concentration (ppm) | | Pinhole Generation Rate (%) | Single Crystal Yield (relative value) |
| --- | --- | --- | --- | --- | --- | --- | --- |
| | Bottom Center | Center - R/2 | | Na + K + Li | Al | | |
| Example 1 | 1 | 1.3 | 100 | 0.5 | 14 | 0.08 | 1 |
| Example 2 | 0.8 | 1.1 | 70 | 0.5 | 14 | 0.04 | 1 |
| Example 3 | 0.8 | 1.1 | 70 | 0.1 | 14 | 0.02 | 1 |
| Example 4 | 0.8 | 1.1 | 70 | 0.1 | 8 | 0.04 | 1 |
| Comparative Example 1 | 1.8 | 2.5 | 60 | 0.5 | 13 | 0.5 | 1 |
| Comparative Example 2 | 1 | 1.3 | 140 | 0.5 | 14 | 0.16 | 1 |

The present invention has thus been shown and described with reference to the preferred embodiments. However, it As shown in Chart 1, in the crucible sample in which the thickness of the first synthetic silica glass layer was 1.0-1.3 mm, the OH group concentration was 100 pm, the total impurity concentration of Na, K and Li was 0.5 ppm, and the impurity concentration of Al was 14 ppm, the pinhole generation rate was 0.08% which was a good result being less than a pinhole generation rate of 0.1%. In addition, the single crystal yield was 1.

Example 2

Other than a thickness of the first synthetic silica glass layer being 0.8-1.1 mm and the OH group concentration being 70 ppm, a crucible sample having the same structure as in example 1 was prepared, the silicon single crystal was pulled up under the same conditions as example 1, and the pinhole generation rate of the silicon single crystal ingot was measured. As a result, as shown in Chart 1, the first synthetic silica glass layer was thinner than in example 1, and the pinhole generation rate of example 2 which had a lower OH group concentration was 0.04% which was even lower than the pinhole generation rate of example 1. In addition, the single crystal yield was 1.

Example 3

Other than the total impurity concentration of Na, K and Li of the natural silica glass layer being 0.1%, a crucible sample having the same structure as in example 2 was prepared, the silicon single crystal was pulled up under the same conditions as example 1, and the pinhole generation rate of the silicon single crystal ingot was measured. As a result, as shown in Chart 1, the pinhole generation rate of example 3 which had a lower total impurity concentration of Na, K and Li than example 2 was 0.02%, which was the lowest pinhole generation rate of all the examples. In addition, the single crystal yield was 1.

Example 4

Other than the concentration of Al of the natural silica glass layer being 8 ppm, a crucible sample having the same structure as in example 3 was prepared, the silicon single crystal was pulled up under the same conditions as example 1, and the pinhole generation rate of the silicon single crystal ingot was measured. As a result, as shown in Chart 1, the pinhole generation rate of example 3 in which the Al concentration was lower than example 2 was 0.04%. Thus the pinhole generation rate in example 4 increased from example 3. In addition, the single crystal yield was 1.

Comparative Example 1

Other than a thickness of the first synthetic silica glass layer being 1.8-2.5 mm and the OH group concentration being 60 ppm, a crucible sample having almost the same structure as in example 1 was prepared, the silicon single crystal was pulled up under the same conditions as example 1, and the pinhole generation rate of the silicon single crystal ingot was measured. As a result, as shown in Chart 1, the pinhole generation rate of comparative example 1 which had a thicker first synthetic silica layer than example 1 was 0.5%, which is a significant increase. In addition, the single crystal yield was 1.

Comparative Example 2

Other than the OH group concentration of the first synthetic silica glass layer being 140 ppm, a crucible sample having the same structure as in example 1 was prepared, the silicon single crystal was pulled up under the same conditions as example 1, and the pinhole generation rate of the silicon single crystal ingot was measured. As a result, as shown in Chart 1, the pinhole generation rate of comparative example 2 which had a higher OH group concentration than comparative example 2 was 0.16%, which is a significant increase the same as comparative example 1. In addition, the single crystal yield was 1.

What is claimed is:

1. A silica glass crucible used for pulling up a silicon single crystal, comprising:
   a natural silica glass layer that constitutes an outer layer of the crucible; and
   a synthetic silica glass layer that constitutes an inner layer of the crucible, wherein:
   the synthetic silica glass layer includes a first synthetic silica glass layer formed in a region within 50% of a diameter of the crucible from the center of a crucible bottom section, and a second synthetic silica glass layer formed in a region in the remaining diameter of the crucible and which excludes the formation region of the first synthetic silica glass layer,
   the first synthetic silica glass layer has a thickness of 0.5 mm or more and 1.5 mm or less and a concentration of an OH group included in the first synthetic silica glass layer being 100 ppm or less,
   a thickness of the second synthetic silica glass layer is larger than that of the first synthetic silica glass layer, and
   a concentration of an OH group included in the second synthetic silica glass layer is larger than the concentration of the OH group included in the first synthetic silica glass layer.

2. The silica glass crucible as claimed in claim 1, wherein the thickness of the first silica has a minimum value at the center of the crucible bottom section and maximum value at a periphery section.

3. The silica glass crucible as claimed in claim 2, wherein a minimum value of a thickness of the second synthetic silica glass layer at a sidewall section of the crucible is larger than a maximum value of a thickness of the first synthetic silica glass layer.

4. The silica glass crucible as claimed in claim 1, wherein the first synthetic silica glass layer has a thickness of 0.8 mm or more and 1.3 mm or less.

5. The silica glass crucible as claimed in claim 1, wherein the first synthetic silica glass layer has a thickness of 0.8 mm or more and 1.1 mm or less.

6. The silica glass crucible as claimed in claim 1, wherein a total concentration of three elements Na, K and Li included in the natural silica glass layer is 0.5 ppm or less in at least a region covered by the first synthetic silica glass layer.

7. The silica glass crucible as claimed in claim 1, wherein a concentration of Al included in the natural silica glass layer is 10 ppm or more and 200 ppm or less in at least a region covered by the first synthetic silica glass layer.

8. A method for manufacturing the silica glass crucible as claimed in claim 1, the method comprising:
   depositing a natural silica powder which becomes a raw material of a natural silica glass layer on an inner surface of a rotating mold;
   depositing a synthetic silica powder which becomes a raw material of a synthetic silica glass layer on an inner surface of a layer formed by the natural silica powder; and forming a silica glass crucible having the natural silica glass layer and the synthetic silica glass layer by melting the natural silica powder and the synthetic silica powder, wherein the synthetic silica powder is deposited so that a thickness of the synthetic silica glass layer in a region within a certain range from the center of the bottom section of the crucible becomes 0.5 mm or more and 1.5 mm or less.

9. The method as claimed in claim 8, wherein electrolytic refining is performed at the time of melting the natural silica powder and the synthetic silica powder and a total concentration of three elements Na, K and Li which are included in the natural silica glass layer is controlled to 0.5 ppm or less.

10. The method as claimed in claim 8, wherein a concentration of Al in the natural silica powder is 10 ppm or less and 200 ppm or more.

* * * * *